United States Patent [19]

Mueller

[11] 4,415,816
[45] Nov. 15, 1983

[54] MONOLITHICALLY INTEGRATED CIRCUIT FOR THE PRODUCTION OF LONG PULSES

[75] Inventor: Ruediger Mueller, Munich, Fed. Rep. of Germany

[73] Assignee: Siemens Aktiengesellschaft, Berlin & Munich, Fed. Rep. of Germany

[21] Appl. No.: 833,556

[22] Filed: Sep. 15, 1977

[30] Foreign Application Priority Data

Sep. 17, 1976 [DE] Fed. Rep. of Germany ..... 26419158

[51] Int. Cl.³ ...................... H03K 3/017; H03K 5/04
[52] U.S. Cl. .................................. 307/265; 307/267; 357/92
[58] Field of Search .................. 307/265, 267, 308; 357/92, 46

[56] References Cited

U.S. PATENT DOCUMENTS 3,986,199 10/1976 Williams ............................... 357/46
3,989,957 11/1976 Tuccu ................................... 357/92

Primary Examiner—Stanley D. Miller
Assistant Examiner—B. P. Davis
Attorney, Agent, or Firm—Hill, Van Santen, Steadman & Simpson

[57] ABSTRACT

A time base circuit feeds a frequency divider via a current amplifier. A current supply circuit is connected to supply the current amplifier and the frequency divider. The current supply may also be connected to supply the time base circuit; otherwise the time base circuit is responsive to electromagnetic radiation for supplying its own current.

2 Claims, 6 Drawing Figures

MONOLITHICALLY INTEGRATED CIRCUIT FOR THE PRODUCTION OF LONG PULSES

BACKGROUND OF THE INVENTION

1. Field of the Invention

This invention relates to a circuit for producing long pulses, and more particularly to a monolithically integrated circuit for producing long pulses.

2. Description of the Prior Art

Circuits of the type mentioned above were heretofore realized through the utilization of external resistances and/or capacitances.

SUMMARY OF THE INVENTION

The object of the invention, therefore, is to provide a monolithically integrated circuit for producing long pulses with the aid of which individual pulses or pulse trains having a pulse length of from below several milliseconds to above several seconds may be produced without requiring external components.

This object is achieved by providing, in monolithic form, a time base circuit which supplies pulses to a frequency divider, via a current amplifier, at least the current amplifier and the frequency divider being powered from a current supply.

The resulting structure of a circuit of the invention has an advantageously small space requirement when constructed in the I²L technique. The frequency $f_{RO}$ of the time base circuit, say a ring oscillator, can be changed by more than five decimal powers, via the current fed thereto. An additional advantage of using the I²L technique is that the frequency $f_{RO}$ of the ring oscillator becomes very small (smaller than 100 Hz in an eleven stage oscillator) for small currents, e.g. less than 1 nA per gate. Advantageously, operation at the lowest possible power loss is attainable.

BRIEF DESCRIPTION OF THE DRAWINGS

Other objects, features and advantages of the invention, its organization, construction and operation will be best understood from the following description taken in conjunction with the accompanying drawings, on which.

DESCRIPTION OF THE PREFERRED EMBODIMENTS

Figure 1:
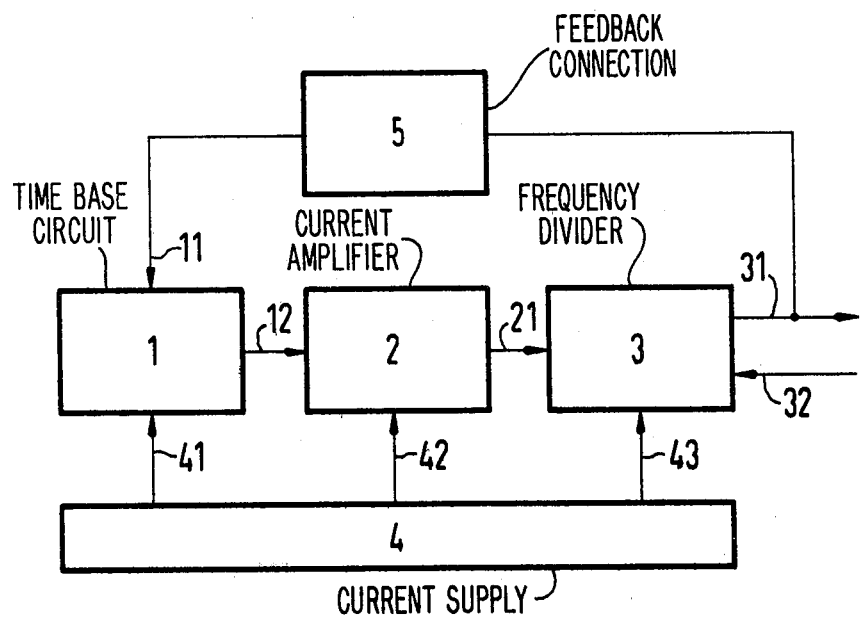
FIG. 1 is a block diagram of apparatus constructed in accordance with the invention.

Referring to FIG. 1, a circuit for producing long pulses comprises a time base circuit 1, preferably a ring oscillator, a current amplifier 2, a frequency divider 3, preferably a binary n-stage frequency divider, and a current supply 4 which provides a plurality of outputs.

The ring oscillator 1 has an output 12 connected to the current amplifier 2. The current amplifier 2 is particularly advantageous for operation of the ring oscillator with small currents. The signal applied to the output 21 of the current amplifier 2 is fed to the binary n-stage frequency divider 3. The circuit components 1, 2 and 3 are supplied with current by the current supply 4.

In order to be able to realize a particularly long pulse length, the time base circuit 1, the current amplifier 2 and the frequency divider 3 are advantageously fed by the different outputs of the supply 4, wherein the ring oscillator 1 is supplied with a low current, and the frequency divider 3, particularly the output stage, is fed with a higher current.

The current supply 4 is constructed, as well known in the art, to provide a plurality of output connections 41, 42 and 43.

In a free-wheeling case, the relation $$f_3 = f_1/2^N$$

exists between the frequency $f_1$ of the ring oscillator 1 and the output frequency $f_3$ at the output 31 of the frequency divider 3, where N is the number of stages of the frequency divider.

Figure 2:
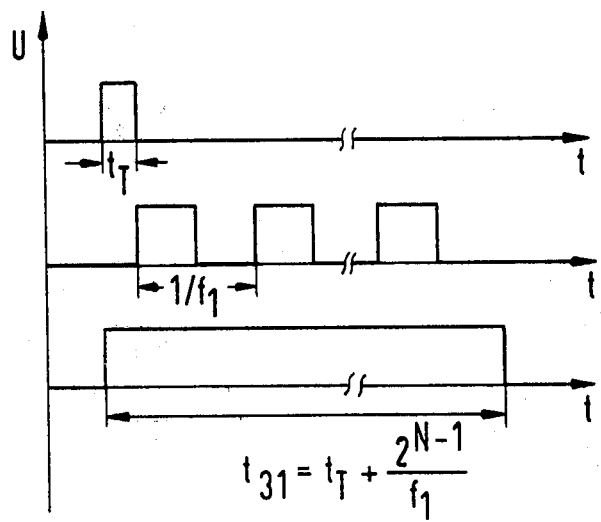
FIG. 2 is a pulse diagram applicable to the circuit of FIG. 1.

As is readily apparent from FIG. 1, the output 31 of the frequency divider 3 may be connected, via a feedback connection 5, with the input 11 of the ring oscillator 1. The ring oscillator 1 does not start to operate until a trigger signal of a duration $t_T$ is received. The trigger signal $t_T$ is applied at the input 32 of the frequency divider 3. An individual pulse of a duration $$t_{31} = t_T + (2^{N-1}/f_1)$$

is subsequently produced at the output 31. FIG. 2 illustrates corresponding pulses.

Figure 3:
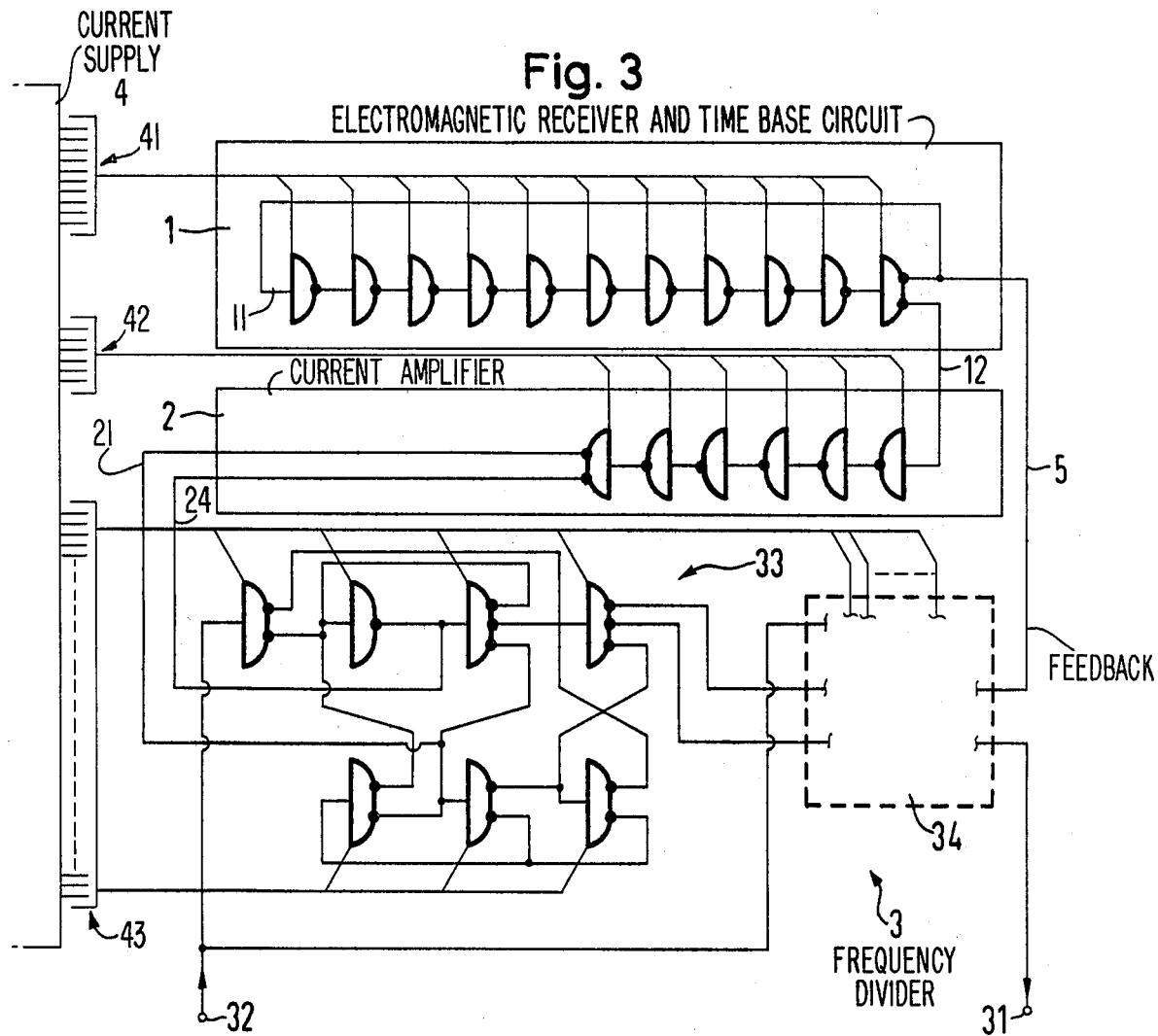
FIG. 3 is a schematic circuit diagram of the apparatus of FIG. 1.

FIG. 3 is a schematic circuit illustration of a circuit for producing long pulses, which circuit is constructed in the I²L technique. The circuit of FIG. 3 essentially comprises individual I²L inverters and I²L gates which are illustrated by the respective symbols at a and b of FIG. 4. Therefore, the circuit in FIG. 4 having a single input and a single output is an I²L inverter and the circuit having a single input and two or more outputs is an I²L gate.

Figure 4:
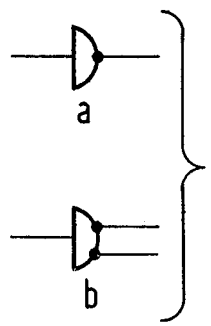
FIG. 4 is a symbolic illustration of an I²L inverter and I²L gate.
Figure 5:
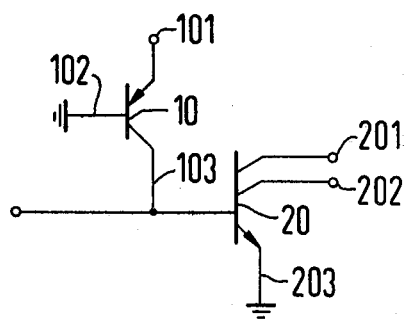
FIG. 5 is a schematic circuit diagram of an I²L gate.

FIG. 5 is a schematic circuit diagram which represents the inverter and the gate of FIG. 4. The circuit comprises a lateral pnp transistor 10 and a vertical npn transistor 20. The vertical npn transistor 20 can have one or more collectors 201, 202. The collector 103 of the transistor 10 is connected to the base of the transistor 20. The base 102 of the transistor 10 and the emitter 203 of the transistor 20 are preferably connected to ground. The collector 103 of the transistor 10, which simultaneously represents the base terminal of the transistor 20, functions as the input of the circuit. The emitter 101 of the transistor 0 is connected to a supply potential.

Figure 6:
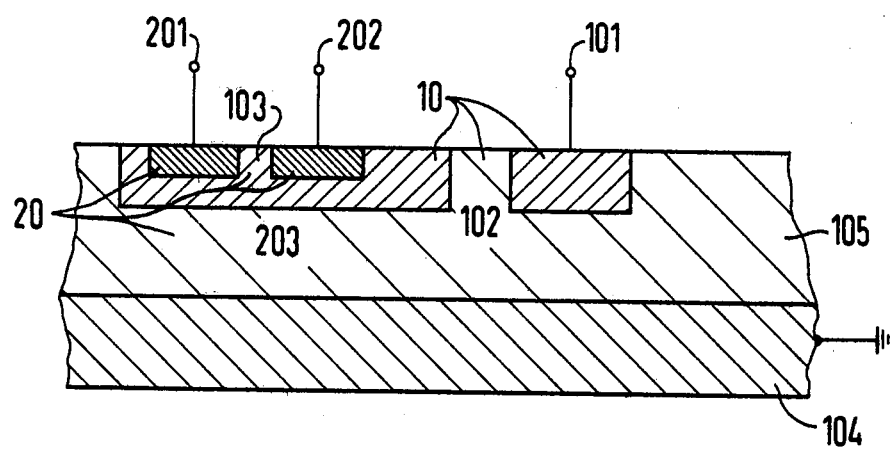
FIG. 6 is a cross-sectional view through a structure equivalent to the circuit of FIG. 5.

FIG. 6 is a schematic cross-sectional representation of an I²L circuit of the type illustrated in FIG. 5. Details of FIG. 6 which were already described in connection with FIG. 5 have corresponding reference characters. As is readily apparent from FIG. 6, the I²L circuit is advantageously constructed in an n-doped semiconductor layer 105 which is arranged on a n+-doped layer 104.

As is apparent from FIG. 3, the ring oscillator 1 comprises an uneven number of I²L gates, connected in series, respectively having an input and an output. Only the last I²L gate of the inverter chain has two outputs. The input of the first I²L gate is referenced 11. The outputs of the last I²L gate of the ring oscillator 1 are referenced 12 and 5, respectively. Such an arranged per se is unstable and oscillates at the frequency $$f_1 = (\tfrac{1}{2} M \cdot t_D)$$

where M represents the uneven number of inverters of the ring oscillator and $t_D$ represents the delay time of an individual pulse or gate, respectively.

The output 12 of the ring oscillator 1 is connected with the input of the current amplifier 2. The current amplifier 2 comprises a number of I²L inverters or gates, respectively, which are connected in a chain. The last I²L gate of the current amplifier has two outputs 21 and 24. The individual gates are dimensioned in a manner known per se so that a current amplification of the signal results at the input 12 when the stage number is increased.

An amplifier stage for the current supply of the I²L circuit may advantageously be constructed in accordance with the teachings in my earlier application entitled "An Amplifier Stage for The Current Supply I²L Circuit", the Ser. No. 800,655, filed May 26, 1977 and based on the German Application No. P 26 24 547.6. Details of such an amplifier may be had by referring to those applications; briefly, however, such an amplifier stage comprises a first CHIL-gate, at least an additional gate, and a second CHIL-gate. The input of the amplifier stage 2 is connected with the output 12 of an I²L gate which is in contact with its injecting emitters having an injector path of a lower current. The outputs of the amplifier stage 2 are connected with the inputs 21 and 24 of a I²L gate of the n-stage frequency divider 3, whose injecting emitters are connected with an injector path of a greater current.

The outputs 21 and 24 of the current amplifier 2, as just mentioned, are connected with the n-stage frequency divider 3. Such an I²L frequency divider, for example, is described by M. Bast in his article "I²L: New Bipolar Logic Having A Higher Packing Density", published in the periodical *Electronic Practice*, No. 10, October 1975, pp. 7–10. In place of the frequency divider, another arbitrary frequency divider can be utilized. Additional n-stage frequency dividers, for example, are described by J. P. L. Lagerberg in his article "A High Density Static Master-Slave Shift Register in I²L", published in the *IEEE Conference Publication*, No. 130, First European Solid-State Circuits Conference, Sept. 2–5, 1975, pp. 16–17, and the article by P. A. Tucci and L. K. Russel entitled "An I²L Watch Chip With Direct LED Drive", published in the *Digest of Technical Papers*, IEEE International Solid-State Circuits Conference 1976, pp. 66–67 and 233. Individual stages of the frequency divider are referenced 33 and 34 in FIG. 3.

An arrangement for the supply of I²L circuits with various currents may utilize the structure disclosed in my earlier application entitled "Arrangement For Supplying I²L Circuits with Differing Currents", Ser. No. 800,633, filed May 26, 1977, and corresponding to the German Application No. P 26 24 584.1. Reference may be made to these applications for greater details. The injectors of the I²L gates of the circuit elements 1, 2 and 3 are connected with individual injector paths which, for their part, are connected with one another via CHIL-gates as described in these earlier applications. Means of such a current supply arrangement 4 (FIG. 1) it is possible to supply the individual outputs of 41, 42 and 43 with different currents. The current supply, for simplicity sake, is not illustrated in FIG. 3, but the appreciation and utilization thereof will be readily apparent to those skilled in the art.

The feedback coupling 5, mentioned above in connection with FIG. 1, can be selectively inserted. If the feedback coupling 5 is present, individual long pulses can be produced at the output 31 after triggering at the input 32.

In another embodiment, the I²L ring oscillator 1 is not connected to a current feed line, but obtains its energy with electromagnetic waves by means of residual beams, preferably with the aid of light. The length of the output signal is approximately proportional to the intensity of the light over several decimal powers. Such a circuit, for example, can be utilized for the control of a camera shutter. The operation of I²L circuits with the aid of light, for example, is well known from the article of C. M. Hart and A. Slob entitled "Integrierte Injektionslogic (I²L)" published in the *Philips Techn. Rundschau* 33, No. 3, 1973/74, pp. 82–91.

Although I have described my invention by reference to particular illustrative embodiments thereof, many changes and modifications of the invention may become apparent to those skilled in the art without departing from the spirit and scope of the invention. I, therefore intend to include within the patent warranted hereon all such changes and modifications as may reasonably and properly be included within the scope of my contribution to the art.

I claim:

1. A monolithically integrated circuit for the production of pulses, comprising:
   a time base circuit comprising a ring oscillator and means responsive to electromagnetic radiation to supply current to said time base circuit;
   a current amplifier;
   a first line connecting said time base circuit to said current amplifier;
   a frequency divider having an output for emitting pulses;
   said time base circuit, said current amplifier and said frequency divider each constructed in the I²L technique and comprising I²L circuits including I²L inverters and I²L gates;
   a second line connecting said current amplifier to said frequency divider;
   a current supply;
   a third line connecting said current supply to said current amplifier; and
   a fourth line connecting said current supply to said frequency divider.

2. A monolithically integrated circuit for the production of pulses, comprising:
   a time base circuit comprising a ring oscillator;
   a current amplifier;
   a first line connecting said time base circuit to said current amplifier;
   a frequency divider having an output for emitting pulses and including a trigger input;
   said time base circuit, said current amplifier and said frequency divider each constructed in the I²L technique and comprising I²L circuits including I²L inverters and I²L gates;
   a second line connecting said current amplifier to said frequency divider;
   a current supply;

a third line connecting said current supply to said current amplifier;

a fourth line connecting said current supply to said frequency divider; and a feedback circuit connected between said output of said frequency divider and said time base circuit for providing a trigger pulse of predetermined time duration.

* * * * *